(12) United States Patent
Yoshida et al.

(10) Patent No.: US 10,164,358 B2
(45) Date of Patent: Dec. 25, 2018

(54) ELECTRICAL FEED-THROUGH AND CONNECTOR CONFIGURATION

(71) Applicant: Western Digital Technologies, Inc., Irvine, CA (US)

(72) Inventors: Kyosuke Yoshida, Yokohama (JP); Kimihiko Sudo, Yokohama (JP); Takako Hayakawa, Hiratsuka (JP); Hajime Eguchi, Fujisawa (JP); Yuta Onobu, Yokoyama (JP)

(73) Assignee: Western Digital Technologies, Inc., Irvine, CA (US)

( * ) Notice: Subject to any disclaimer, the term of this patent is extended or adjusted under 35 U.S.C. 154(b) by 15 days.

(21) Appl. No.: 15/282,783

(22) Filed: Sep. 30, 2016

(65) Prior Publication Data

US 2018/0097301 A1    Apr. 5, 2018

(51) Int. Cl.
| | |
|---|---|
| *G11B 33/12* | (2006.01) |
| *H01R 12/59* | (2011.01) |
| *H01R 12/71* | (2011.01) |
| *H05K 3/30* | (2006.01) |
| *H01R 12/79* | (2011.01) |
| *H05K 3/34* | (2006.01) |
| *H01R 12/75* | (2011.01) |
| *G11B 33/02* | (2006.01) |

(Continued)

(52) U.S. Cl.
CPC .......... *H01R 12/59* (2013.01); *G11B 25/043* (2013.01); *G11B 33/02* (2013.01); *G11B 33/122* (2013.01); *H01R 12/71* (2013.01); *H01R 12/716* (2013.01); *H01R 12/75* (2013.01); *H01R 12/79* (2013.01); *H01R 13/05* (2013.01); *H01R 13/2471* (2013.01); *H01R 13/2485* (2013.01); *H05K 3/308* (2013.01); *H05K 3/34* (2013.01); *H05K 3/3415* (2013.01); *H05K 5/069* (2013.01); *H01R 12/777* (2013.01); *H01R 2201/06* (2013.01)

(58) Field of Classification Search
CPC .... G11B 33/122; H01R 12/71; H01R 12/716; H01R 12/75; H01R 12/79; H05K 3/308; H05K 3/34; H05K 3/3415
USPC ...................................................... 360/99.25
See application file for complete search history.

(56) References Cited

U.S. PATENT DOCUMENTS

| | | | | |
|---|---|---|---|---|
| 6,042,389 A | * | 3/2000 | Lemke ............... | H01R 43/0256 439/74 |
| 6,322,373 B1 | * | 11/2001 | Ohtsuki ................. | H01R 12/79 439/493 |

(Continued)

*Primary Examiner* — Jefferson Evans
(74) *Attorney, Agent, or Firm* — John D. Henkhaus

(57) ABSTRACT

An electrical feed-through assembly includes electrically conductive pins having a top apex and a bottom apex, where the pins extend through at least a majority of an electrically non-conductive material. The top apexes, the bottom apexes, or both the top and bottom apexes of the pins have an electrically conductive connection pad material, such as a solder pad, coupled thereto. In variations, the top and/or bottom apexes may be slightly recessed from a corresponding surface of the non-conductive material, such that the connection pads fill the respective recesses; and/or the top and/or bottom apexes barely extend from a corresponding surface, such that the connection pads bulge out from the corresponding surface. Such a feed-through configuration may inhibit pin bending, in addition to enabling use of more types of connectors beyond pin-and-socket type connectors.

16 Claims, 6 Drawing Sheets

(51) Int. Cl.
   *H01R 13/05*    (2006.01)
   *H01R 13/24*    (2006.01)
   *G11B 25/04*    (2006.01)
   *H05K 5/06*     (2006.01)
   *H01R 12/77*    (2011.01)

(56) References Cited

U.S. PATENT DOCUMENTS

| | | | |
|---|---|---|---|
| 6,577,013 B1 * | 6/2003 | Glenn | H01L 23/3114 257/618 |
| 6,702,592 B1 | 3/2004 | Harden et al. | |
| 6,970,322 B2 * | 11/2005 | Bernett | G11B 33/122 360/245.9 |
| 7,599,147 B2 * | 10/2009 | Gunderson | G11B 33/1466 360/97.22 |
| 7,876,527 B2 * | 1/2011 | Nakamiya | G11B 25/043 360/97.22 |
| 8,059,364 B1 * | 11/2011 | Andrikowich | G11B 25/043 360/99.22 |
| 8,098,454 B2 | 1/2012 | Kouno et al. | |
| 8,179,631 B2 | 5/2012 | Aoyagi et al. | |
| 8,279,552 B2 | 10/2012 | Stipe | |
| 8,487,187 B2 | 7/2013 | VandenEynden et al. | |
| 9,196,303 B2 | 11/2015 | Hirano et al. | |
| 2005/0118854 A1 * | 6/2005 | Lange | H01R 12/7017 439/329 |
| 2006/0013961 A1 * | 1/2006 | Fournier | C25D 5/022 427/429 |
| 2006/0050429 A1 * | 3/2006 | Gunderson | G11B 33/122 360/99.21 |
| 2007/0026700 A1 * | 2/2007 | Brandenburg | H01R 43/0256 439/83 |
| 2007/0152018 A1 * | 7/2007 | Cachina | B23K 1/0008 228/101 |
| 2007/0238359 A1 * | 10/2007 | Gutierrez | H01F 27/027 439/620.01 |
| 2009/0168233 A1 * | 7/2009 | Kouno | G11B 33/1466 360/99.21 |
| 2009/0168381 A1 * | 7/2009 | Suehiro | H05K 3/3421 361/772 |
| 2009/0200074 A1 * | 8/2009 | Douriet | H01L 23/49827 174/265 |
| 2010/0032808 A1 * | 2/2010 | Ding | H01L 21/6835 257/621 |
| 2010/0065323 A1 * | 3/2010 | Kawamura | B23K 3/0623 174/263 |
| 2010/0230825 A1 * | 9/2010 | von Kaenel | H01L 23/49816 257/777 |
| 2011/0237027 A1 * | 9/2011 | Kim | H01L 25/16 438/107 |
| 2011/0260928 A1 * | 10/2011 | Ito | H01Q 9/0407 343/700 MS |
| 2012/0228000 A1 * | 9/2012 | Wu | H01R 13/2435 174/128.1 |
| 2015/0098178 A1 | 4/2015 | Otake et al. | |
| 2015/0216024 A1 * | 7/2015 | Kwong | H05K 9/0067 361/220 |
| 2016/0255728 A1 * | 9/2016 | Kanda | B23K 1/0016 361/767 |
| 2016/0380372 A1 * | 12/2016 | Hsieh | H01R 24/60 439/676 |
| 2018/0126175 A1 * | 5/2018 | Seitz | A61N 1/3754 |

* cited by examiner

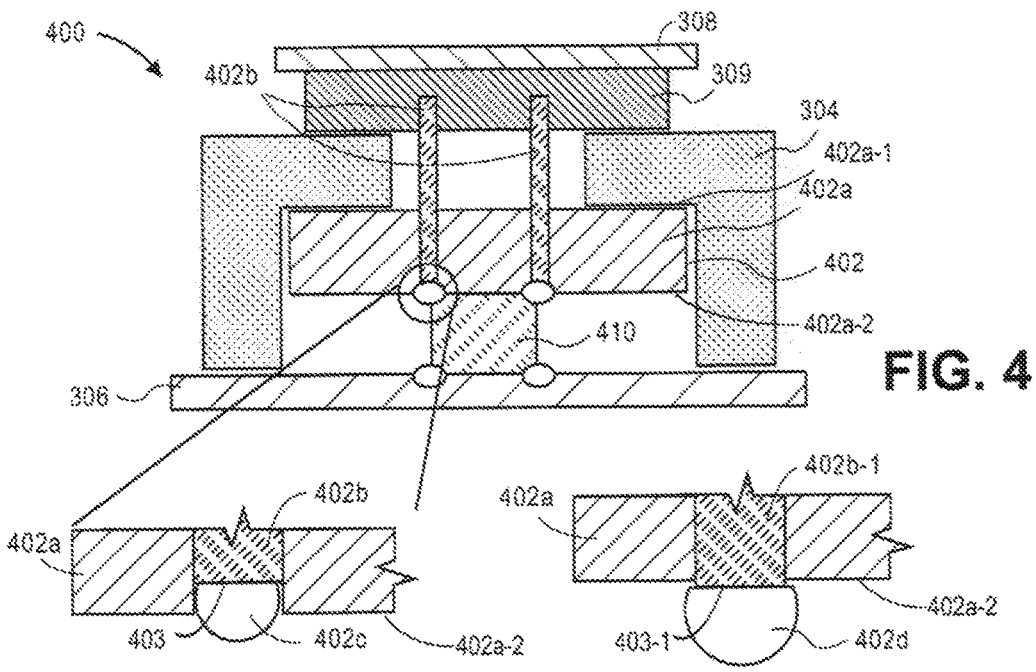
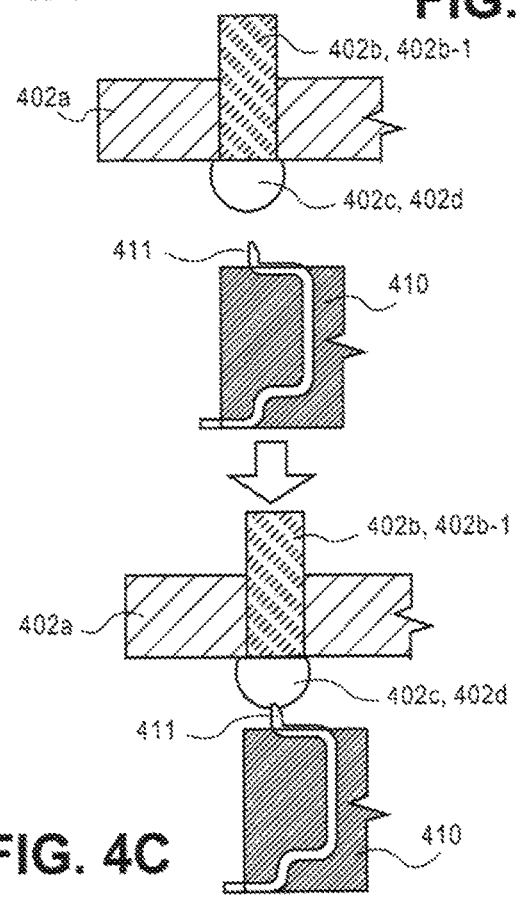
FIG. 4
FIG. 4A    FIG. 4B
FIG. 4C

AFFIX AN ELECTRICAL FEED-THROUGH ASSEMBLY TO A DATA STORAGE DEVICE ENCLOSURE COMPRISING A BASE COMPRISING AN APERTURE ENCOMPASSED BY THE ELECTRICAL FEED-THROUGH ASSEMBLY, WHEREIN THE FEED-THROUGH ASSEMBLY COMPRISES:

AN ELECTRICALLY NON-CONDUCTIVE MATERIAL HAVING A TOP SURFACE AND A BOTTOM SURFACE OF A MAIN BODY,

A PLURALITY OF ELECTRICALLY CONDUCTIVE PINS HAVING A TOP APEX AND A BOTTOM APEX AND EXTENDING THROUGH AT LEAST A MAJORITY OF THE MAIN BODY, AND

AN ELECTRICALLY CONDUCTIVE CONNECTION PAD MATERIAL COUPLED TO THE BOTTOM APEXES OF THE PINS;
602

ELECTRICALLY CONNECT AN ELECTRICAL CONNECTOR PART TO THE ELECTRICAL FEED-THROUGH ASSEMBLY,

WHEREIN COMPRESSION-TYPE TERMINALS OF THE CONNECTOR PART ARE ELECTRICALLY CONNECTED TO THE PINS OF THE FEED-THROUGH THROUGH THE CONNECTION PAD MATERIAL
604

ELECTRICALLY CONNECT A FLEXIBLE ELECTRICAL CABLE ASSEMBLY, WHICH IS WITHIN THE ENCLOSURE, TO THE ELECTRICAL FEED-THROUGH ASSEMBLY THROUGH CONNECTION PAD MATERIAL COUPLED TO THE TOP APEXES OF THE PINS
606

FIG. 6

ELECTRICAL FEED-THROUGH AND CONNECTOR CONFIGURATION

FIELD OF EMBODIMENTS

Embodiments of the invention may relate generally to data storage devices and more particularly to an improved electrical feed-through structure.

BACKGROUND

A hard-disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head uses a magnetic field to read data from and write data to the surface of a magnetic-recording disk. A write head makes use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording medium.

HDDs are being manufactured which are hermetically sealed with helium inside. Further, other gases that are lighter than air have been contemplated for use as a replacement for air in sealed HDDs. There are various benefits to sealing and operating an HDD in helium ambient, for example, because the density of helium is one-seventh that of air. For example, operating an HDD in helium reduces the drag force acting on the spinning disk stack and the mechanical power used by the disk spindle motor is substantially reduced. Further, operating in helium reduces the flutter of the disks and the suspension, allowing for disks to be placed closer together and increasing the areal density (a measure of the quantity of information bits that can be stored on a given area of disk surface) by enabling a smaller, narrower data track pitch. The lower shear forces and more efficient thermal conduction of helium also mean the HDD will run cooler and will emit less acoustic noise. The reliability of the HDDs is also increased due to low humidity, less sensitivity to altitude and external pressure variations, and the absence of corrosive gases or contaminants.

Electronic systems that require a hermetically sealed internal volume (e.g., a lighter-than-air gas filled, sealed HDD) need a way of connecting electrical lines through the enclosure. This is typically accomplished with a hermetic electrical connector, or electrical "feed-through" connector (or simply a "feed-through"). One possible approach may involve the use of a low permeability feed-through, such as a glass-metal feed-through. This type of feed-through typically includes straight pins on each side, and is typically soldered to the HDD base at the feed-through sidewall.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY OF EMBODIMENTS

Embodiments of the invention are generally directed at an electrical feed-through assembly, a data storage device comprising such a feed-through assembly, and a method of assembling a data storage device comprising such a feed-through assembly. The electrical feed-through assembly comprises electrically conductive pins having a top apex and a bottom apex, where the pins extend through at least a majority of an electrically non-conductive material. Either the top apexes, the bottom apexes, or both the top and bottom apexes of the pins have an electrically conductive connection pad material, such as a solder pad, coupled thereto. In embodiments, the top and/or bottom apexes may be slightly recessed from a corresponding surface of the non-conductive material, such that the connection pads fill the respective recesses; and/or the top and/or bottom apexes barely extend from a corresponding surface, such that the connection pads bulge out from the corresponding surface. For non-limiting examples, such a feed-through configuration may inhibit pin bending, in addition to enabling use of more types of connectors beyond pin-and-socket type connectors.

Embodiments discussed in the Summary of Embodiments section are not meant to suggest, describe, or teach all the embodiments discussed herein. Thus, embodiments of the invention may contain additional or different features than those discussed in this section. Furthermore, no limitation, element, property, feature, advantage, attribute, or the like expressed in this section, which is not expressly recited in a claim, limits the scope of any claim in any way.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 4 is a cross-sectional side view illustrating an electrical feed-through at an internal-external interface, according to an embodiment;

FIG. 4A is a magnified cross-sectional side view illustrating an electrical feed-through pin part of the electrical feed-through of FIG. 4, according to an embodiment;

FIG. 4B is a magnified cross-sectional side view illustrating an electrical feed-through pin part of the electrical feed-through of FIG. 4, according to an embodiment;

FIG. 4C is a magnified cross-sectional side view illustrating an electrical feed-through pin part of the electrical feed-through of FIG. 4, electrically connecting with a connector, according to an embodiment;

FIG. 6 is a flow diagram illustrating a method of assembling a data storage device, according to an embodiment.

DETAILED DESCRIPTION

Approaches to an electrical feed-through are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of an electrical feed-through for a hard disk drive (HDD), such as at an interface between internal and external environments. Thus, in accordance with an embodiment, a plan view illustrating an HDD 100 is shown in FIG. 1 to illustrate an exemplary operating context.

Figure 1:
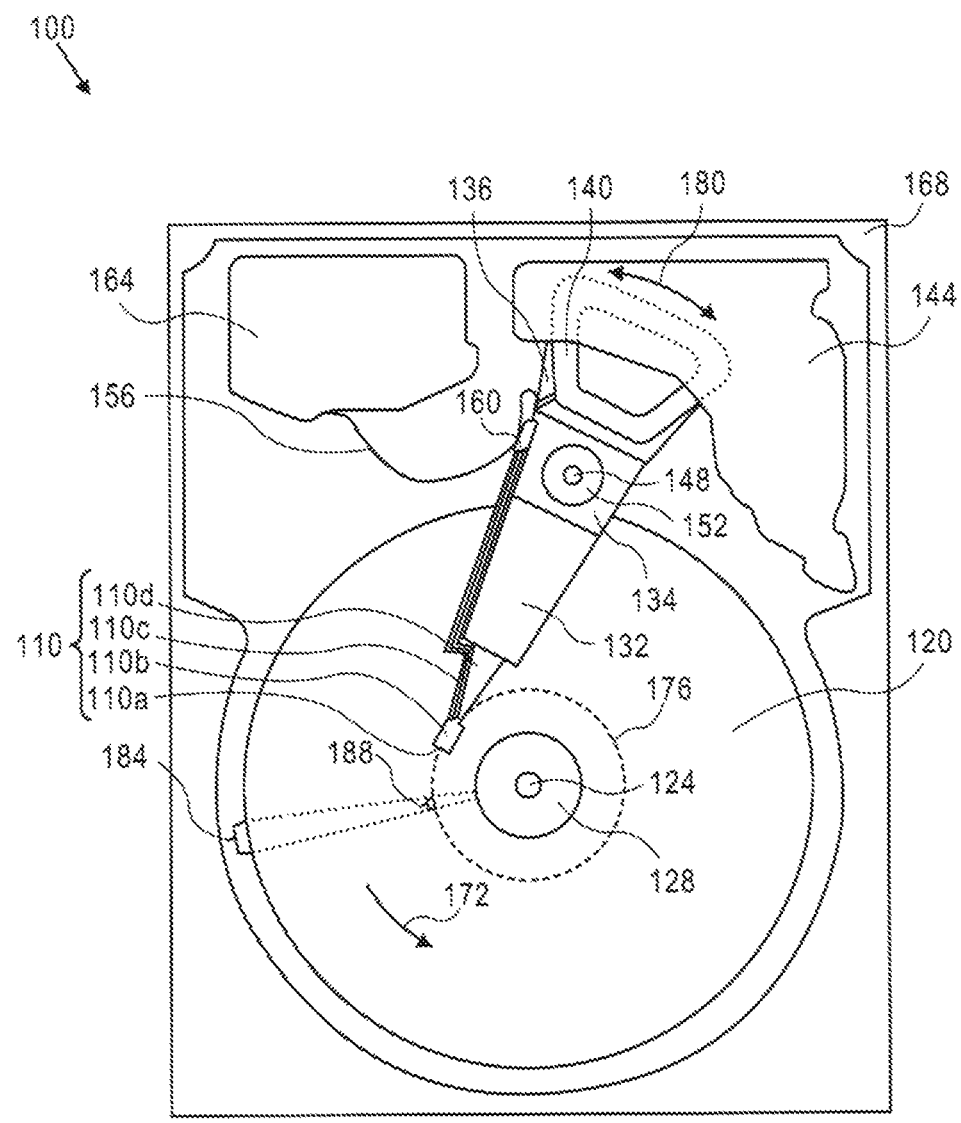
FIG. 1 is a plan view illustrating a hard disk drive (HDD), according to an embodiment.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable"). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

The term "hermetic" will be understood to describe a sealing arrangement designed to have nominally no (or negligible) gaseous leakage or permeation paths. While terms such as "hermetic", "negligible leakage", "no leakage", etc. may be used herein, note that such a system would often still have a certain amount of permeability and, therefore, not be absolutely leak free. Hence, the concept of a desired or target "leak rate" may be referred to elsewhere herein. As discussed, electronic systems that require a hermetically sealed internal volume (e.g., a lighter-than-air gas filled, sealed HDD) need a way of connecting electrical lines through the enclosure, and there remains challenges regarding a low leakage rate versus the cost, manufacturability, and reliability of a suitable electrical feed-through.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

Figure 2:
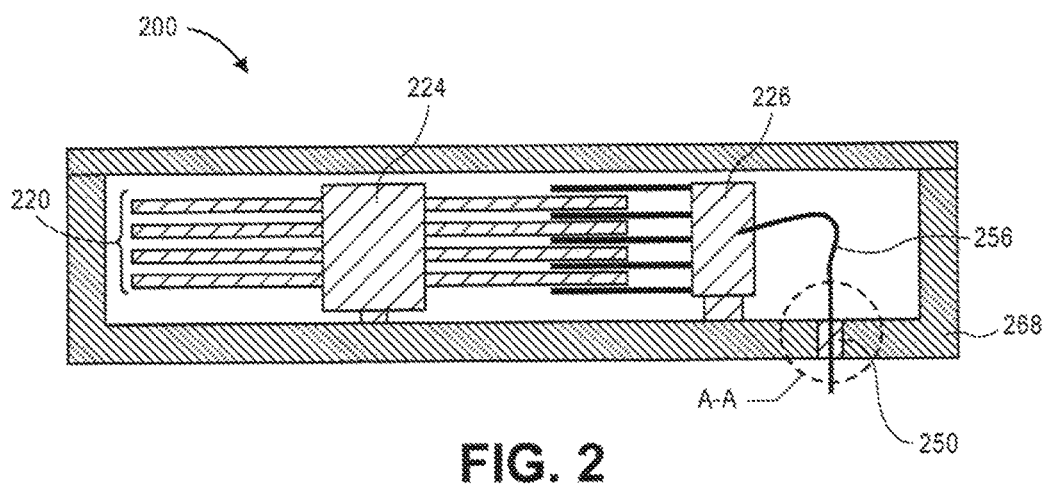
FIG. 2 is a cross-sectional side view illustrating a hard disk drive (HDD), according to an embodiment.

FIG. 2 is a cross-sectional side view illustrating a hard disk drive (HDD), according to an embodiment. For example, HDD 200 comprises at least one recording medium 220 (e.g., such as magnetic-recording medium 120 of FIG. 1) rotatably mounted on a spindle 224 (e.g., such as spindle 124 of FIG. 1) of a drive motor that drives the rotation of the recording medium 220, and a head stack assembly (HSA) 226 that carries and moves a head slider housing a read-write transducer to locations over the recording medium 220 for reading information from and writing information to the recording medium 220. HDD 200 further comprises a flexible cable assembly (FCA) 256 that electrically connects the HSA 226 to an electronic component external to the hermetically-sealed internal environment of HDD 200, such as to a printed circuit board (e.g., an "SOC", or system-on-a-chip) that may be coupled to the HDD 200. In so doing, the FCA 256 is routed through an interface 250 (e.g., mechanical and/or electrical), which includes a small opening, which is associated with an HDD enclosure base 268 (e.g., similar to a hermetically-sealed version of housing 168 of FIG. 1). FIG. 2 further illustrates an area A-A near and including the interface 250, which may be referenced elsewhere herein.

As mentioned, in the context of a sealed hard disk drive, a hermetic electrical connector may be used to electrically connect (e.g., an internal flexible cable with an external onboard printed circuit board assembly), where one approach may involve the use of a low permeability feed-through (e.g., a glass-metal feed-through), typically soldered to the HDD base at the feed-through sidewall. For a non-limiting example of a feed-through connector, reference is made to U.S. Pat. Appl. Publ. No. 2015/0098178.

Figure 3:
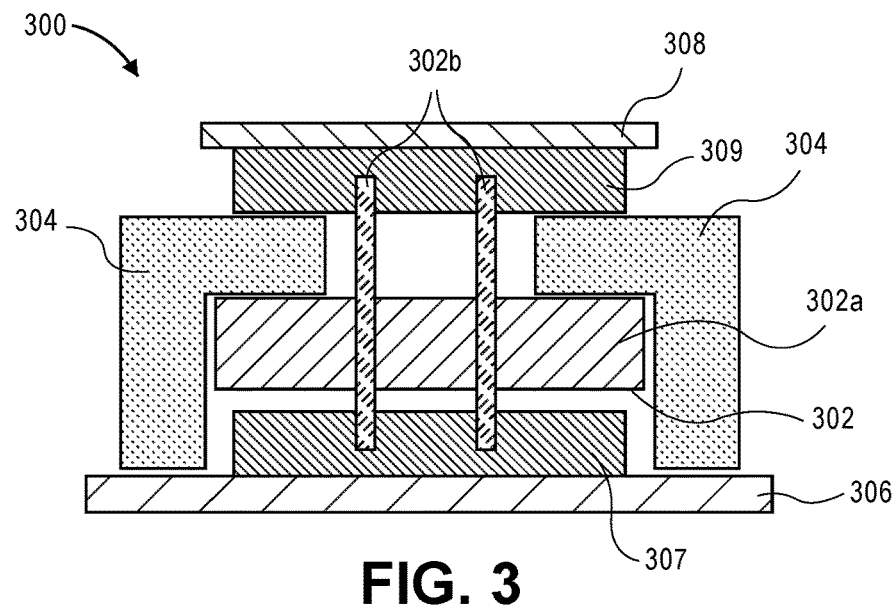
FIG. 3 is a cross-sectional side view illustrating an electrical feed-through at an internal-external interface.

FIG. 3 is a cross-sectional side view illustrating an electrical feed-through at an internal-external interface. Reference is made to area A-A of FIG. 2 for locational context with respect to an HDD, for example. Interface 300 comprises an electrical feed-through 302 coupled to an enclosure base 304. Feed-through 302 comprises an electrically non-conductive material 302a, through which a plurality of electrically conductive pins 302b extend completely therethrough. The pins 302b are electrically connected at a bottom end to a printed circuit board (PCB) 306 by way of a socket 307, and at a top end to a flexible cable assembly (FCA) 308 by way of a socket 309.

Figure 3A:
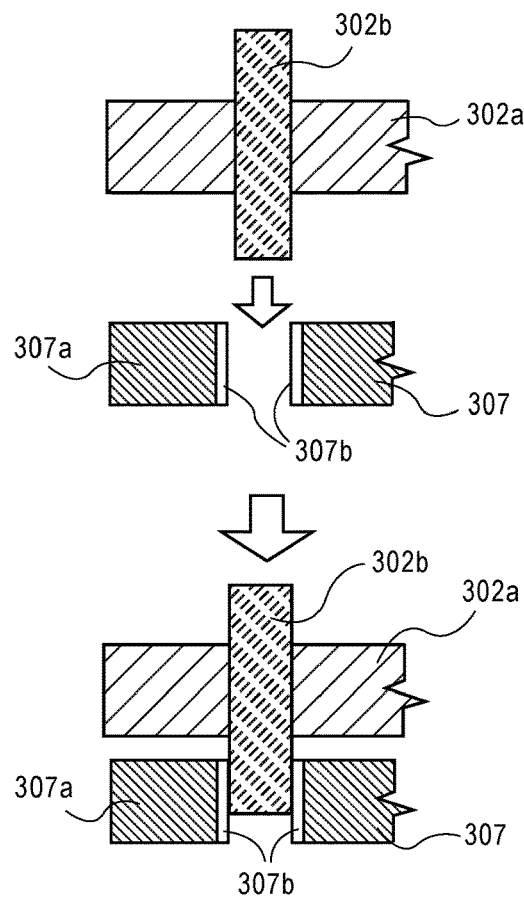
FIG. 3A is a magnified cross-sectional side view illustrating an electrical feed-through pin part of the electrical feed-through of FIG. 3, electrically connecting with a socket.

FIG. 3A is a magnified cross-sectional side view illustrating an electrical feed-through pin part of the electrical feed-through of FIG. 3, electrically connecting with a socket. FIG. 3A illustrates that each pin 302b of feed-through 302 is inserted into an electrically conductive electrode terminal 307b of a housing 307a of the socket 307, to make electrical interconnectivity between the feed-through 302 and the PCB 306. Similarly, each pin 302b of feed-through 302 may be inserted into an electrically conductive electrode terminal 307b of a housing 307a of the socket 309, to make electrical interconnectivity between the feed-through 302 and the FCA 308. It is appreciated that such a feed-through 302 configuration at the interface 300 may experience pin 302b bending during assembly or re-assembly, where a bent pin 302b may reduce the manufacturing efficiency, yield, and reliability of the device because of possible contact failure with the socket 307, 309. In addition, a feed-through such as feed-through 200 is limited to electrically connecting to a mating pin-and-socket type of connector.

Electrical Feed-Through Assembly with Connection Pad Material

FIG. 4 is a cross-sectional side view illustrating an electrical feed-through at an internal-external interface, according to an embodiment. Reference is again made to area A-A of FIG. 2 for locational context with respect to an HDD, for example. Interface 400 comprises an electrical feed-through 402 coupled to an enclosure base 304, where feed-through 402 comprises an electrically non-conductive material 402a (e.g., glass) through which a plurality of electrically conductive pins 402b, each having a top apex and a bottom apex, extend at least a majority of the way therethrough. The number of pins 402b constituent to an electrical feed-through such as feed-through 402 may vary from implementation to implementation.

In addition to the use of glass for the non-conductive material 402a, use of other materials is contemplated. For example, and according to embodiments, a feed-through such as feed-through 402 may comprise a ceramic material or a resin material.

The non-conductive material 402a has a top surface 402a-1 and a bottom surface 402a-2 of a main body. The pins 402b are electrically connected at a bottom end to a printed circuit board (PCB) 306 by way of a connector 410, and at a top end to a flexible cable assembly (FCA) 308 by way of a socket 309. According to an embodiment, connector 410 comprises a compression-type connector that has spring terminals (also referred to as "compression-type terminals" or "compression-type pins", or at times referred to in the art as a "P2 connector"), which is a style of connector that can be used to electrically connect to and communicate with a PCB, for example.

According to an embodiment, at least one of the top and bottom apexes of the pins 402b have an electrically conductive connection pad material coupled thereto. FIG. 4A is a magnified cross-sectional side view illustrating an electrical feed-through pin part of the electrical feed-through of FIG. 4, according to an embodiment. FIG. 4A depicts a pin 402b that has a bottom apex 403 that is recessed from the bottom surface 402a-2 of the non-conductive material 402a, where the bottom apex 403 has a connection pad material 402c coupled thereto. According to an embodiment, the connection pad material 402c comprises a solder pad. Thus, with the recessed bottom apex 403 of pin 402b, the solder pad connection pad material 402c fills the recess created by the recession of the pin 402b and the bottom surface 402a-2 of non-conducting material 402a. A similar configuration of connection pad material 402c coupled to the bottom apex 403 of pin 402b may be utilized for more, or all, of the plurality of pins 402b of feed-through 402.

Alternatively to the use of solder pads for the connection pad material 402c, the use of other materials and/or surface treatments for the top and bottom apexes of pins 402b is contemplated. For example, and according to embodiments, each apex of a pin 402b may be plated with gold or with palladium. For example, and according to other embodiments, an entire pin 402b may be plated with gold or with palladium.

FIG. 4B is a magnified cross-sectional side view illustrating an electrical feed-through pin part of the electrical feed-through of FIG. 4, according to an embodiment. FIG. 4A depicts a pin 402b-1 that has a bottom apex 403-1 that barely extends from the bottom surface 402a-2 of the non-conductive material 402a, where the bottom apex 403-1 has a connection pad material 402d coupled thereto. The distance that the bottom apex 403-1 extends from the bottom surface 402a-2 may vary from implementation to implementation based on, for example, design goals, available space, type of connection pad material 402d used, type of connector 410 used, and the like. However, for comparison purposes, the bottom apex 403-1, when barely extending beyond the bottom surface 402a-2, extends far less than the pins 302b of FIG. 3 and, therefore, pin bending is inhibited in comparison. According to an embodiment, the connection pad material 402d comprises a solder pad. Thus, with the slightly extended bottom apex 403-1 of pin 402b-1, the solder pad connection pad material 402d bulges out from the bottom surface 402a-2 of non-conducting material 402a, especially in comparison to connection pad material 402c of FIG. 4A. A similar configuration of connection pad material 402d coupled to the bottom apex 403-1 of pin 402b-1 may be utilized for more, or all, of the plurality of pins 402b of feed-through 402.

According to an embodiment, the pin-connection pad configurations depicted and described in reference to FIGS. 4A, 4B may be combined for provisioning the pins 402b of a given feed-through 402. That is, some pins 402b could be recessed from the bottom surface 402a-2 of the non-conductive material 402a (e.g., FIG. 4A), while some other pins 402b could be barely extending from the bottom surface 402a-2 of the non-conductive material 402a (e.g., FIG. 4B).

FIG. 4C is a magnified cross-sectional side view illustrating an electrical feed-through pin part of the electrical feed-through of FIG. 4, electrically connecting with a connector, according to an embodiment. FIG. 4C illustrates that each pin 402b, 402b-1 of feed-through 402 may be electrically connected with a conductive electrode terminal 411 of a connector 410, to make electrical interconnectivity between the feed-through 402 and the PCB 306.

Figure 5:
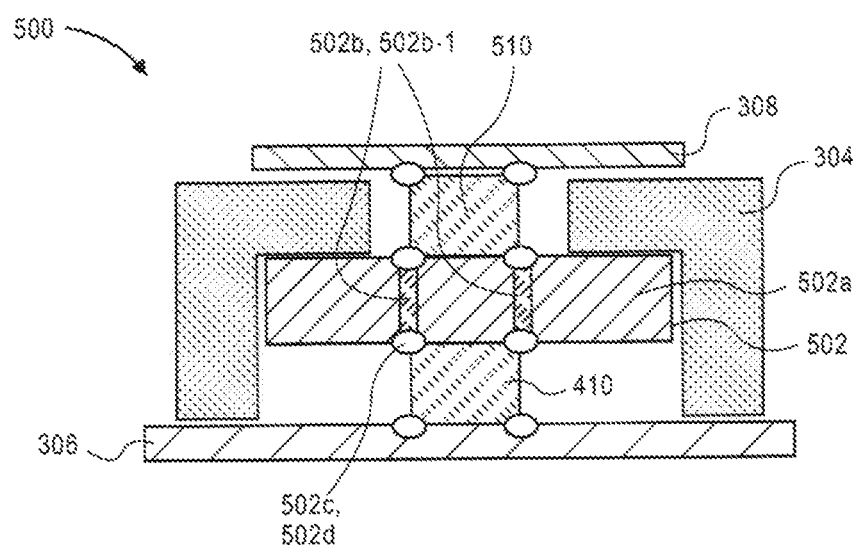
FIG. 5 is a cross-sectional side view illustrating an electrical feed-through at an internal-external interface, according to an embodiment.

FIG. 5 is a cross-sectional side view illustrating an electrical feed-through at an internal-external interface, according to an embodiment. Reference is again made to area A-A of FIG. 2 for locational context with respect to an HDD, for example. Similarly to with the bottom apexes 403, 403-1 of pins 402b, 402b-1 of FIGS. 4-4C, interface 500 comprises an electrical feed-through 502 coupled to an enclosure base 304, where feed-through 502 comprises an electrically non-conductive material 502a through which a plurality of electrically conductive pins 502b (and/or 502b-1, similar to 402b-1), each having a top apex and a bottom apex, extend at least a majority of the way therethrough. The number of pins 502b, 502b-1 constituent to an electrical feed-through such as feed-through 502 may vary from implementation to implementation. Not only are the pins 502b electrically connected at a bottom end to a printed circuit board (PCB) 306 by way of a connector 410 (as with FIG. 4), the pins 502b are also electrically connected at a top end to a flexible cable assembly (FCA) 308 by way of a connector 510. According to an embodiment, connector 510 comprises a compression-type connector.

According to an embodiment, both the top and bottom apexes of the pins 502b, 502b-1 have an electrically conductive connection pad material coupled thereto. Reference is made to FIGS. 4A, 4C and the corresponding description for variations of embodiments regarding how the top and/or bottom apexes of each pin 502b may be configured similarly to pin 402b (e.g., FIG. 4A), where the bottom and top apexes may be recessed from the respective bottom and top surfaces of the non-conductive material 502a, and where a connection pad material 502c is coupled thereto. Similarly, reference is made to FIGS. 4B, 4C and the corresponding description for variations of embodiments regarding how the top and/or bottom apexes of each pin 502b-1 may be configured similarly to pin 402b-1 (e.g., FIG. 4B), where the bottom and top apexes may barely extend from the respective bottom and top surfaces of the non-conductive material 502a, and where a connection pad material 502d is coupled thereto.

Method of Assembling a Data Storage Device

FIG. 6 is a flow diagram illustrating a method of assembling a data storage device, according to an embodiment. For example, the method of FIG. 6 could be employed to assemble feed-through 402 (FIG. 4) and/or feed-through 502 (FIG. 5) to enclosure base 304 (FIGS. 3-5).

At block 602, an electrical feed-through assembly is affixed to a data storage device enclosure comprising a base comprising an aperture encompassed by the electrical feed-through assembly, wherein the feed-through assembly comprises (a) an electrically non-conductive material having a top surface and a bottom surface of a main body, (b) a plurality of electrically conductive pins having a top apex and a bottom apex and extending through at least a majority of the main body, and (c) an electrically conductive connection pad material coupled to the bottom apexes of the pins. For example, the feed-through assembly 402, 502 is affixed to a data storage device enclosure comprising a base (e.g., enclosure base 268 of FIG. 2; base 304 of FIGS. 3, 4, 5) comprising an aperture (e.g., see interface 250 of FIG. 2) encompassed by the electrical feed-through assembly 402, 502.

At block 604, according to an embodiment, an electrical connector part is electrically connected to the electrical feed-through assembly, where compression-type terminals of the connector part are electrically connected to the pins of the feed-through the connection pad material. For example, electrical connector part 410, 510 (FIGS. 4, 5) is electrically connected to an electrical feed-through assembly 402, 502 (FIGS. 4, 5), where compression-type terminals of the connector part 410, 510 are electrically connected to the pins 402b, 502b of the feed-through 402, 502 through the connection pad material 402c, 402d, 502c, 502d. The manner in which the electrical connector part 410, 510 is electrically connected to the feed-through 402, 502, may vary from implementation to implementation. For non-limiting examples, a screen-printing process or a dispenser process may be used to electrically connect the two parts. With a screen-printing process, a solder paste (e.g., connection pad material) is squeegeed onto the feed-through pins through a solder mask, the connector part mounted, and then the solder reflowed (e.g., using heat). With a dispenser process, solder paste (e.g., connection pad material) is dispensed onto the feed-through pins using a dispenser, the connector part mounted, and then the solder reflowed.

At optional block 606 (depicted as optional with a dashed block), a flexible electrical cable assembly, which is within the enclosure, is electrically connected to the electrical feed-through assembly through the connection pad material coupled to the top apexes of the pins. For example, the flexible cable assembly 308 (FIG. 5), which is within the enclosure (see, e.g., FCA 256 of FIG. 2), is electrically connected to the electrical feed-through assembly 502 (FIG. 5) through the connection pad material 502c, 502d (FIG. 5) coupled to the top apexes of the pins 502b, 502b-1 (FIG. 5). According to an embodiment, the flexible cable assembly 308 is electrically connected to the electrical feed-through assembly 502 (FIG. 5) by way of an electrical connector part, such as electrical connector part 510 (FIG. 5), through the connection pad material 502c, 502d coupled to the top apexes of the pins 502b, 502b-1.

In the context of the foregoing method, note that with respect to the electrical connector part, the configuration of the electrical feed-through assembly, the printed circuit board, and/or the flexible cable assembly may vary from implementation to implementation. That is, the electrical connector part 410, 510 (FIGS. 4, 5) may already be assembled with the printed circuit board 306 (FIGS. 4, 5) and/or flexible cable assembly 308 (FIG. 5), respectively, and then electrically connected to the electrical feed-through assembly 402, 502 (FIGS. 4, 5), respectively (e.g., after the feed-through assembly 402, 502 is affixed to the base). Alternatively, the electrical connector part 410, 510 may already be assembled with the electrical feed-through assembly 402, 502, and then electrically connected to the printed circuit board 306 and/or flexible cable assembly 308, respectively (e.g., before or after the feed-through assembly 402, 502 is affixed to the base).

According to an embodiment, the electrical feed-through 402, 502 is configured to interface between a hermetically-sealed environment and an external environment. For example, the hermetically-sealed environment may be the internal cavity of a sealed hard disk drive having a lighter-than-air gas largely sealed therein. Hence, optionally and according to an embodiment, a hermetically-sealed enclosure comprising the base 304 is substantially filled with a lighter-than-air gas. For example, a hermetically-sealed HDD such as HDD 200 (FIG. 2) is manufactured having the feed-through 402, 502 and base 304 as described herein, and is filled with a lighter-than air gas such as helium or nitrogen.

Extensions and Alternatives

Implementation and use of embodiments described herein are not limited solely to individual data storage devices or HDDs. Rather, embodiments involving the use of an electrical feed-through to enclosure base interface as described to provide a well-positioned and controlled hermetic interface seal, may also be applied to a system level sealed tray or box of multiple HDDs enclosed in a box containing gas like He or $N_2$, as well as to hermetically-sealed electronic devices, generally (e.g., optical systems, optical data storage devices, and the like).

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alpha-numeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. An electrical feed-through assembly component comprising:
    an electrically non-conductive material having a top surface and a bottom surface of a main body;
    a plurality of electrically conductive pins having a top apex and a bottom apex and extending through at least a majority of said main body; and
    solder pads coupled to said top and said bottom apexes of said pins;
    wherein one of said top and bottom apexes of said pins are recessed from a corresponding said top or bottom surface of said main body of said non-conductive material, such that said solder pads coupled to said apexes that are recessed fill a respective recess created by recession of said pins from said corresponding surface;

wherein the other of said top and bottom apexes of said pins marginally extend from a corresponding said top or bottom surface of said main body of said non-conductive material, such that said solder pads coupled to said apexes that extend bulge out from said corresponding surface.

2. The electrical feed-through assembly of claim 1, wherein said pins comprise gold plating or palladium plating.

3. The electrical feed-through assembly of claim 1, wherein said non-conductive material comprises a ceramic or a resin.

4. A data storage device comprising:
a disk medium rotatably mounted on a spindle;
a read-write head slider comprising a read-write transducer configured to read from and to write to said disk medium;
a voice coil actuator configured to move said head slider to access portions of said disk medium;
an electrical feed-through assembly component comprising:
  an electrically non-conductive material having a top surface and a bottom surface of a main body,
  a plurality of electrically conductive pins having a top apex and a bottom apex and extending through at least a majority of said main body, and
  solder pads coupled to at least one of said top and said bottom apexes of said pins; and
an enclosure comprising a base with which said electrical feed-through is coupled,
  wherein said base includes an aperture encompassed by said electrical feed-through;
wherein:
at least one of said top and bottom apexes of said pins are recessed from respective said top and bottom surfaces of said main body of said non-conductive material of said feed-through assembly, such that any said solder pads coupled to said apexes that are recessed fills a respective recess created by recession of said pins from said top and/or bottom surfaces; or
at least one of said top and bottom apexes of said pins marginally extend from respective said top and bottom surfaces of said main body of said non-conductive material of said feed-through assembly, such that any said solder pads coupled to said apexes that extend bulges out from said top and/or bottom surfaces.

5. The data storage device of claim 4, further comprising:
an electrical connector part electrically connected to said pins through said solder pads.

6. The data storage device of claim 5, further comprising:
a printed circuit board coupled with said base;
wherein said connector part is electrically connected on one side to said pins via compression-type terminals and electrically connected on another side to said printed circuit board.

7. The data storage device of claim 4, wherein said solder pads are coupled to both of said top and said bottom apexes of said pins.

8. The data storage device of claim 7, further comprising:
a first electrical connector part electrically connected to said bottom apexes of said pins through said corresponding solder pads;
a second electrical connector part electrically connected to said top apexes of said pins through said corresponding solder pads;
a printed circuit board coupled with said base; and
a flexible electrical cable assembly within said enclosure;

wherein said first connector part is electrically connected to said bottom apexes of said pins via compression-type terminals and electrically connected to said printed circuit board;
wherein said second connector part is electrically connected to said top apexes of said pins via compression-type terminals and electrically connected to said flexible cable assembly.

9. The data storage device of claim 4,
wherein at least one of said top and bottom apexes of said pins are recessed from respective said top and bottom surfaces of said main body of said non-conductive material of said feed-through assembly, such that each said solder pad fills a respective recess created by recession of said pins from said top and/or bottom surfaces.

10. The data storage device of claim 4,
wherein at least one of said top and bottom apexes of said pins marginally extend from respective said top and bottom surfaces of said main body of said non-conductive material of said feed-through assembly, such that each said solder pad bulges out from said top and/or bottom surfaces.

11. The data storage device of claim 4,
wherein one of said top and bottom apexes of said pins are recessed from a corresponding said top or bottom surface of said main body of said non-conductive material of said feed-through assembly, such that each said solder pad coupled to said one of said top and bottom apexes fills a respective recess created by recession of said pins from said corresponding surface;
wherein the other of said top and bottom apexes of said pins marginally extend from a corresponding said top or bottom surface of said main body of said non-conductive material of said feed-through assembly, such that each said solder pad coupled to said other of said top and bottom apexes bulges out from said corresponding surface.

12. A method of assembling a data storage device, the method comprising:
affixing a pre-assembled electrical feed-through assembly component to a data storage device enclosure comprising a base comprising an aperture encompassed by said electrical feed-through assembly, wherein said feed-through assembly comprises:
  an electrically non-conductive material having a top surface and a bottom surface of a main body,
  a plurality of electrically conductive pins having a top apex and a bottom apex and extending through at least a majority of said main body,
  wherein:
    at least one of said top and bottom apexes of said pins are recessed from respective said top and bottom surfaces of said main body of said non-conductive material of said feed-through assembly, such that each said solder pad fills a respective recess created by recession of said pins from said top and/or bottom surfaces; or
    at least one of said top and bottom apexes of said pins marginally extend from respective said top and bottom surfaces of said main body of said non-conductive material of said feed-through assembly, such that each said solder pad bulges out from said top and/or bottom surfaces, and
  solder pads coupled to at least one of said top and said bottom apexes of said pins;

electrically connecting an electrical connector part to said electrical feed-through assembly, wherein compression-type terminals of said connector part are electrically connected to said pins of said feed-through through said solder pads.

13. The method of claim 12, wherein said electrical connector part is electrically connected to a printed circuit board, and wherein said feed-through assembly further comprises solder pads coupled to said top apexes of said pins, the method further comprising:

electrically connecting a flexible electrical cable assembly, which is within said enclosure, to said electrical feed-through assembly through said solder pads coupled to said top apexes of said pins.

14. A method of manufacturing an electrical feed-through assembly, the method comprising:

applying solder pads to at least one of a top apex and a bottom apex of a plurality of electrically conductive pins extending through at least a majority of a main body of an electrically non-conductive material having a top surface and a bottom surface;

wherein:
  at least one of said top and bottom apexes of said pins are recessed from respective said top and bottom surfaces of said main body of said non-conductive material, such that each said solder pad fills a respective recess created by recession of said pins from said top and/or bottom surfaces; or
  at least one of said top and bottom apexes of said pins marginally extend from respective said top and bottom surfaces of said main body of said non-conductive material, such that each said solder pad bulges out from said top and/or bottom surfaces;

wherein said applying includes:
  a screen-printing process, or
  a dispenser process.

15. The method of claim 14, wherein said applying includes said screen-printing process, in which a solder paste is squeegeed onto said at least one of said top apex and said bottom apex of said electrically conductive pins through a solder mask, the method further comprising:

electrically connecting a connector part to said electrically conductive pins,
  wherein said electrically connecting comprises:
  mounting a connector part to said electrically conductive pins, and
  reflowing said solder paste.

16. The method of claim 14, wherein said applying includes said dispenser process, in which a solder paste is directly dispensed onto said at least one of said top apex and said bottom apex of said electrically conductive pins, the method further comprising:

electrically connecting a connector part to said electrically conductive pins,
  wherein said electrically connecting comprises:
  mounting a connector part to said electrically conductive pins, and
  reflowing said solder paste.

* * * * *